(12) United States Patent
Lim

(10) Patent No.: US 11,348,906 B2
(45) Date of Patent: May 31, 2022

(54) OPTOELECTRONIC DEVICE COMPRISING A PHOSPHOR PLATE AND METHOD OF MANUFACTURING THE OPTOELECTRONIC DEVICE

(71) Applicant: OSRAM Opto Semiconductors GmbH, Regensburg (DE)

(72) Inventor: Choon Kim Lim, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/982,066

(22) PCT Filed: Mar. 21, 2018

(86) PCT No.: PCT/EP2018/057191
§ 371 (c)(1),
(2) Date: Sep. 18, 2020

(87) PCT Pub. No.: WO2019/179618
PCT Pub. Date: Sep. 26, 2019

(65) Prior Publication Data
US 2021/0098432 A1 Apr. 1, 2021

(51) Int. Cl.
*H01L 25/075* (2006.01)
*H01L 33/00* (2010.01)
(Continued)

(52) U.S. Cl.
CPC ........ *H01L 25/0753* (2013.01); *H01L 25/167* (2013.01); *H01L 33/0093* (2020.05); *H01L 33/505* (2013.01); *H01L 2933/0041* (2013.01)

(58) Field of Classification Search
CPC ............. H01L 25/0753; H01L 33/0093; H01L 25/167; H01L 33/505; H01L 2933/0041;
(Continued)

(56) References Cited

U.S. PATENT DOCUMENTS 6,486,499 B1 * 11/2002 Krames ................... H01L 33/38
257/81
6,576,488 B2 * 6/2003 Collins, III ............ C25D 13/02
438/29
(Continued)

FOREIGN PATENT DOCUMENTS

WO 2013030718 A1 3/2013

OTHER PUBLICATIONS

International Search Report based on PCT Application PCT/EP2018/057191 dated Dec. 3, 2018, 5 pages (for reference purpose only).
(Continued)

*Primary Examiner* — Bo B Jang
(74) *Attorney, Agent, or Firm* — Viering, Jentschura & Partner MBB

(57) ABSTRACT

An optoelectronic device comprises a phosphor plate, an optoelectronic chip comprising a layer stack of a first optoelectronic semiconductor layer and a second optoelectronic semiconductor layer, a first electrode, and a second electrode. The optoelectronic chip is attached to the phosphor plate, so that the second optoelectronic semiconductor layer is arranged between the phosphor plate and the first optoelectronic semiconductor layer. The first electrode and the second electrode are arranged on a first main surface of the first optoelectronic semiconductor layer on a side remote from the phosphor plate. The second electrode directly contacts the first optoelectronic semiconductor layer.

16 Claims, 9 Drawing Sheets

(51) Int. Cl.
*H01L 25/16* (2006.01)
*H01L 33/50* (2010.01)

(58) Field of Classification Search
CPC ....... H01L 33/62; H01L 27/153; H01L 33/20; F21K 9/00
USPC .................. 257/88–93, 98–100, E33.001
See application file for complete search history.

(56) References Cited

U.S. PATENT DOCUMENTS

| | | | |
|---|---|---|---|
| 9,257,619 B2* | 2/2016 | Ichikawa | H01L 33/501 |
| 2006/0202105 A1 | 9/2006 | Krames et al. | |
| 2010/0019260 A1 | 1/2010 | Epler et al. | |
| 2014/0077242 A1 | 3/2014 | Lee | |
| 2016/0141446 A1 | 5/2016 | Huang et al. | |
| 2018/0013046 A1 | 1/2018 | Huang et al. | |

OTHER PUBLICATIONS

Blech et al.: "Detailed Study of PECVD Silicon Nitride and Correlation of Various Characterization Techniques"; Proceedings of the 24th European Photovoltaic Solar Energy Conference and Exhibition; 2009; 5 pages.

Lee et al.: "High Light-Extraction GaN-Based Vertical LEDs with double diffuse surfaces", IEEE Journal of Quantum Electronics—Jan. 2007, pp. 1196-1201.

Liang et al.: "Low-Temperature, Strong SiO2-SiO2 Covalent Wafer Bonding for III-V Compound Semiconductors-to-Silicon Photonic Integrated Circuits", Journal of Electronics, 2008.

Chen et al.: "Zigzag and Helical AlN Layer Prepared by Glancing Angle Deposition and Its Application as a Buffer Layer in a GaN-Based Light-Emitting Diode", Journal of Nanomaterials vol. 2012.

* cited by examiner

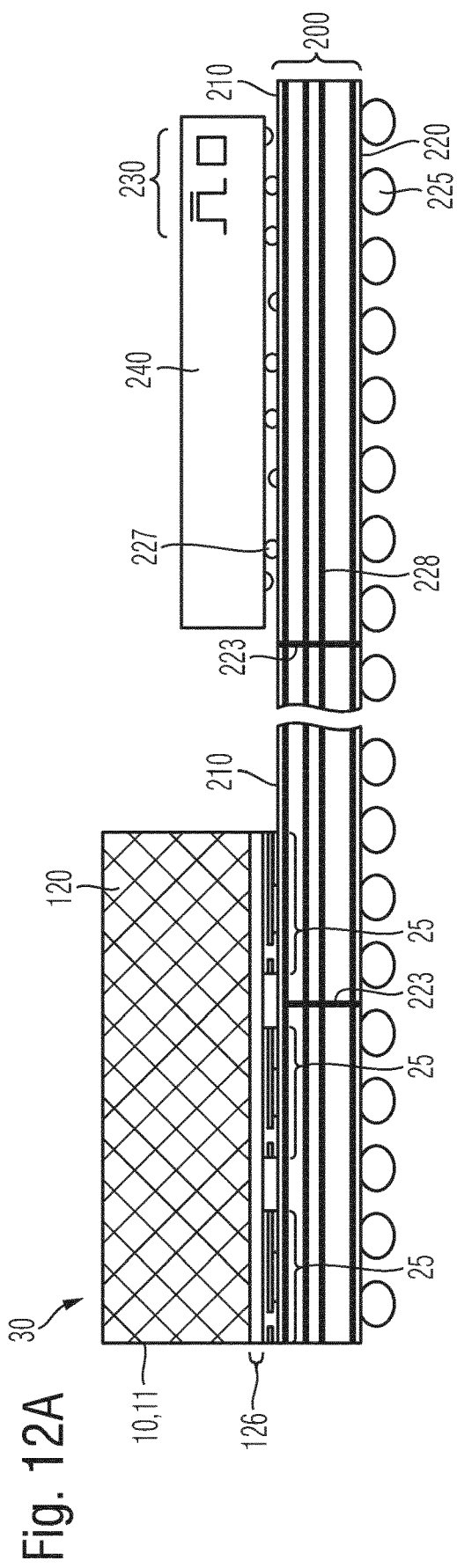
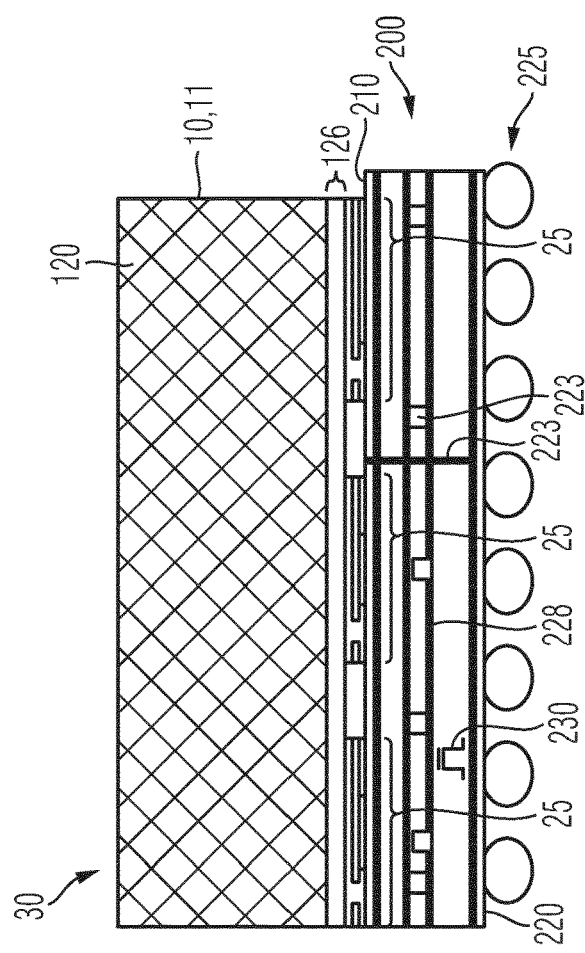

OPTOELECTRONIC DEVICE COMPRISING A PHOSPHOR PLATE AND METHOD OF MANUFACTURING THE OPTOELECTRONIC DEVICE

CROSS-REFERENCE TO RELATED APPLICATIONS

The present application is a national stage entry according to 35 U.S.C. § 371 of PCT application No.: PCT/EP2018/057191 filed on Mar. 21, 2018; which is incorporated herein by reference in their entirety and for all purposes.

TECHNICAL FIELD

An optoelectronic component with a phosphor plate is disclosed. In addition, a method for manufacturing such a device is specified.

BACKGROUND

A light-emitting diode (LED) is a light-emitting device based on semiconductor materials. Generally, a LED comprises a pn junction. When electrons and holes are recombined with each other in the pn junction, e.g. by applying a corresponding voltage, electromagnetic radiation is generated. LEDs have been developed for a variety of applications comprising display devices, illumination devices, vehicle lights, projectors and others.

A light-emitting device may be configured to emit, e.g. white light by combining an LED chip with a suitable phosphor. For example, a blue LED chip comprising a semiconductor material in an appropriate band gap region may be combined with e.g. a yellow phosphor that is capable of emitting yellow light when being excited by the light of the blue LED chip. By using an appropriate type of phosphor or converter, arbitrary colors of light may be achieved.

Generally attempts are being made in order to further miniaturize light-emitting devices.

Accordingly, it is an object of the present disclosure to provide an improved optoelectronic device as well as an improved method for manufacturing an optoelectronic device.

SUMMARY

According to embodiments, an optoelectronic device comprises a phosphor plate, an optoelectronic chip comprising a layer stack of a first optoelectronic semiconductor layer and a second optoelectronic semiconductor layer, a first electrode, and a second electrode. The optoelectronic chip is attached to the phosphor plate, so that the second optoelectronic semiconductor layer is arranged between the phosphor plate and the first optoelectronic semiconductor layer. The first electrode and the second electrode are arranged on a first main surface of the first optoelectronic semiconductor layer on a side remote from the phosphor plate. The second electrode directly contacts the first optoelectronic semiconductor layer.

For example, the optoelectronic chip may be attached to the phosphor plate via a bonding layer between a first main surface of the second optoelectronic semiconductor layer and a second main surface of the phosphor plate.

According to embodiments, the bonding layer may contact the phosphor plate. The optoelectronic device may further comprise an index smoothing layer between the optoelectronic chip and the bonding layer. For example, the bonding layer is silicon oxide.

According to embodiments, the optoelectronic device may comprise at least two optoelectronic chips. For example, the phosphor plate may comprise notches arranged between adjacent optoelectronic chips. As a result, light from adjacent pixels may be "isolated" in an improved manner and a pixel contrast may be improved.

An integrated circuit comprises the optoelectronic device as described above and a carrier substrate, the optoelectronic chip of the optoelectronic device being mounted to the carrier substrate. The integrated circuit may further comprise circuit elements arranged in the carrier substrate. Alternatively, the circuit elements may be arranged in a driver substrate that is mounted to the carrier substrate.

A method for manufacturing an optoelectronic device comprises bonding an optoelectronic substrate to a phosphor plate, the optoelectronic substrate comprising a growth substrate and optoelectronic semiconductor layers over the growth substrate, so that a side of the optoelectronic substrate remote from the growth substrate is arranged on a side of the phosphor plate. Thereafter, the growth substrate is removed.

The method may further comprise forming a first bonding layer over the first main surface of the optoelectronic substrate before bonding the optoelectronic substrate to the phosphor plate. According to further embodiments, the first main surface of the optoelectronic substrate may be directly bonded to the phosphor plate. The method may further comprise forming an electrode contacting the optoelectronic layers after removing the growth substrate.

According to embodiments, an electric device comprises the optoelectronic device as defined above or the integrated circuit as defined above. For example, the electric device may be a display device and a lighting system.

BRIEF DESCRIPTION OF THE DRAWINGS

The accompanying drawings are included to provide a further understanding of embodiments and are incorporated in and constitute a part of this specification. The drawings illustrate the embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

FIGS. 12A and 12B show cross-sectional views of integrated circuits according to further embodiments.

DETAILED DESCRIPTION

Figure 1:
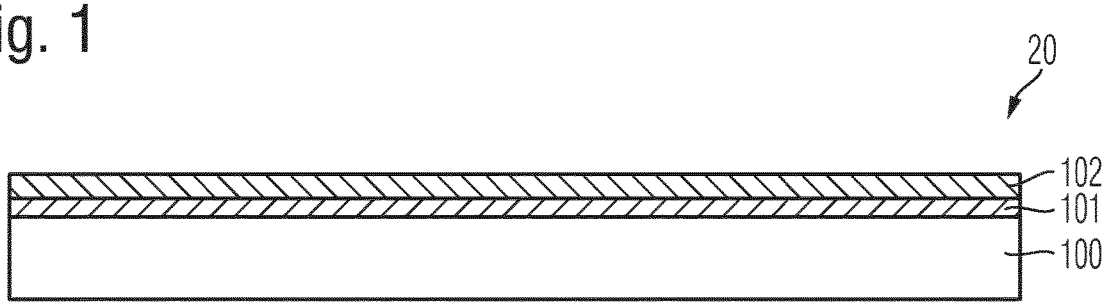
FIG. 1 shows a cross-sectional view of an example of an optoelectronic substrate.

In the following detailed description reference is made to the accompanying drawings, which form a part hereof and in which are illustrated by way of illustration specific embodiments may be practiced. In this regard, directional terminology such as "top", "bottom", "front", "back", "over", "on", "above", "leading", "trailing" etc. is used with reference to the orientation of the Figures being described. Since components of embodiments can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include doped and undoped semiconductors, epitaxial semiconductor layers, e.g. supported by a base semiconductor foundation, and other semiconductor structures. For example, a layer of a first semiconductor material may be grown on a growth substrate of a second semiconductor material. Depending on the purpose of use, the semiconductor may be based on a direct or an indirect semiconductor material. Examples of semiconductor materials particularly suitable for generation of electromagnetic radiation comprise nitride-compound semiconductors, by which e.g. ultraviolet or blue light or longer wavelength light may be generated, such as GaN, InGaN, AlN, AlGaN, AlGaInN, phosphide-compound semiconductors, by which e.g. green or longer wavelength light may be generated such as GaAsP, AlGaInP, GaP, AlGaP, as well as further semiconductor materials including AlGaAs, SiC, ZnSe, GaAs, ZnO, $Ga_2O_3$, diamond, hexagonal BN and combinations of these materials. Further examples of semiconductor materials may as well be silicon, silicon-germanium and germanium. In the context of the present specification, the term "semiconductor" further encompasses organic semiconductor materials.

The specification relates to an optoelectronic chip and to optoelectronic semiconductor layers. Conventionally, forming an LED chip may comprise growing optoelectronic semiconductor layers, e.g. an n-type layer and a p-type layer over a growth substrate. Optionally, the grown structure may be transferred to a support substrate which is different from the growth substrate. The electromagnetic radiation may be generated in the pn junction formed by the optoelectronic semiconductor layers. The purpose of the growth substrate or the support substrate is to support or to carry the optoelectronic semiconductor layers. In the context of the present specification, the term "optoelectronic semiconductor layers" refers to those layers of the optoelectronic device which contribute to the generation of the electromagnetic radiation emitted by the optoelectronic device. For example, the optoelectronic semiconductor layers may comprise any kind of semiconductor layer sequence which may be configured to emit electromagnetic radiation. Specific examples comprise inter alia a pn junction, a double heterostructure, a single quantum well structure, a multiple quantum well structure and/or a quantum cascade structure. The term "optoelectronic chip" refers to a stack of optoelectronic semiconductor layers that may optionally be supported by a growth substrate.

The present specification relates to a phosphor plate. Within the context of the present specification any kind of phosphor that withstands the described processing may be employed. Generally, a phosphor accomplishes a wavelength shift of absorbed light. Examples of phosphor materials comprise metal oxides, metal halides, metal sulfides, metal nitrides and others. These compounds may further comprise additives that may result in specific wavelengths being emitted. For example, the additives may comprise rare earth materials. As an example of a yellow phosphor, $YAG:Ce^{3+}$ (cerium-activated yttrium aluminum garnet $(Y_3Al_5O_{12})$) or $(Sr_{1.7}Ba_{0.2}Eu_{0.1})SiO_4$ may be employed. Further phosphors may be based on $MSiO_4:Eu^{2+}$, wherein M may be Ca, Sr or Ba. By selecting the cations with an appropriate concentration, a desired conversion wavelength may be selected. As will be readily appreciated, a phosphor may comprise several different phosphor materials emitting different wavelengths or having different properties. Further examples of phosphors include quantum dots. The quantum dots may be based on e.g. CdS, CdSe, PbS or further suitable semiconductor materials. Many further examples of suitable phosphors are known.

According to implementations, the phosphor material, e.g. a phosphor powder may be embedded in a suitable matrix material. For example, the matrix material may comprise a resin or polymer composition such as a silicone or an epoxy resin. For example, a size of the phosphor particles may be in a micron-or nano-size range. For example, when quantum dots are employed as a phosphor, crystallites of quantum dots may be arranged in a suitable matrix material.

According to further implementations, the matrix material may comprise a glass. By way of example, the converter material may be formed by sintering the glass, e.g. $SiO_2$ with further additives and phosphor powder to form a phosphor in glass (PiG). According to embodiments, quantum dots may be arranged in a glass matrix.

According to further implementations, the phosphor material itself may be sintered to form a ceramic. For example, as a result of the sintering process, the ceramic phosphor may have a polycrystalline structure.

According to further implementations, the phosphor material may be grown to form a single-crystalline phosphor, e.g. by employing the Czochralski (Cz) technique.

According to embodiments, any implementation of a phosphor material may be used, wherein the specific implementation withstands the described processing method.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 is a cross-sectional view of an optoelectronic substrate 20 according to embodiments. For example, the optoelectronic substrate may comprise a growth substrate 100 which may be made of sapphire, for example. A first optoelectronic semiconductor layer 101, e.g. made of GaN or InGaN, of a first conductivity type, e.g. n-type may be epitaxially grown on the growth substrate 100. Further, a second optoelectronic semiconductor layer 102 of a second conductivity type, e.g. p-type may be epitaxially grown over the first optoelectronic semiconductor layer 101. The thicknesses of the semiconductor layers 101, 102 are chosen in accordance with known methods in order to provide a desired functionality. As is clearly to be understood, depending on the material of the first and second semiconductor layer, a suitable material of the growth substrate may be chosen. The optoelectronic substrate 20 may comprise further layers. For example, one or more quantum well layers may be arranged between the first optoelectronic semiconductor layer 101 and the second optoelectronic semiconductor layer 102.

The first main surface 21 of the optoelectronic substrate 20 may be further processed in order to reduce reflections at the first main surface 21 of the optoelectronic substrate. For example, the refractive index of the material at the first main surface 21 may be adapted to the refractive index of a material to be subsequently formed at the first main surface. According to embodiments, the refractive index of the material at the first main surface 21 may be reduced. This may comprise forming an index smoothing layer 103 as will be explained hereinbelow with reference to FIG. 2A.

In the context of the present specification, the term "index smoothing layer" refers to a layer or layer stack that is configured to increase the extraction efficiency of an optoelectronic device by modifying the interface or boundary between semiconductor material and adjacent material at an emission surface. The emission surface may be the first main surface 105 of the second semiconductor layer 102. For example, the index smoothing layer may have a varying refractive index so that at the interface between index smoothing layer and adjacent material, the refractive index is closer to that of the adjacent material. At the interface between semiconductor material and index smoothing layer, the refractive index is closer to the refractive index of the semiconductor material. According to further concepts, the surface of the semiconductor material or the surface of the index smoothing layer may be processed in order to reduce internal reflections or total reflections at the boundary between semiconductor material and adjacent material.

Figure 2A:
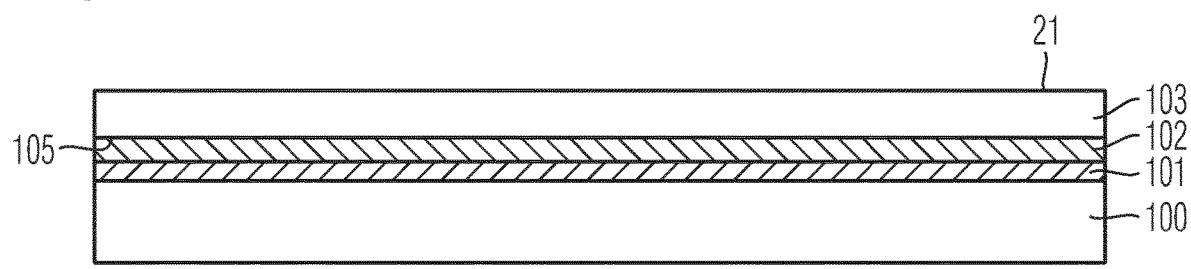
FIGS. 2A to 2C show cross-sectional views of examples of the optoelectronic substrate after performing a further processing step.

FIG. 2A shows a cross-sectional view of an optoelectronic substrate comprising an index smoothing layer 103. According to embodiments, the index smoothing layer 103 may be a silicon nitride layer having a varying stoichiometry of the silicon nitride material. In more detail, by varying the stoichiometry of silicon nitride, the refractive index of the silicon nitride layer may be varied, e.g. from 2.5 to 1.8. This may be achieved by performing a deposition process while varying a ratio of $SiH_4/NH_3$. For example, this may be implemented in a manner that the index smoothing layer 103 has a refractive index close to the optical index of the second semiconductor layer 102 at the vicinity of the interface between the index smoothing layer 103 and the second semiconductor layer 102. Further, with increasing distance from this interface, the refractive index of the index smoothing layer 103 may be reduced.

Alternatively or in addition to the above processing, the main surface 105 of the second semiconductor layer 102 may be roughened. For example, this may be achieved by growing the second semiconductor layer 102 having a larger thickness than a target thickness of the second semiconductor layer 102. Thereafter, an etching process may be performed which roughens the resulting first main surface 105 of the second semiconductor layer 102. For example this may be accomplished using KOH as an etchant. As a further alternative, further semiconductor material of the second conductivity type may be grown or deposited in a structured manner so as to achieve a roughened surface 104 of the second semiconductor layer 102.

Figure 2B:
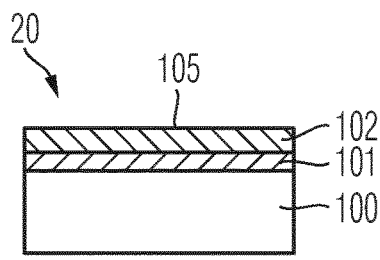
Figure 2C:
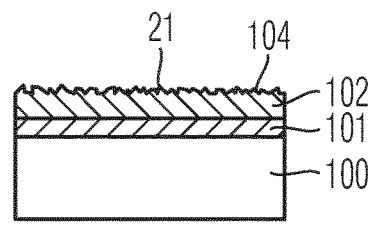

FIG. 2B shows a cross-sectional view of an optoelectronic substrate 20. The layer thickness of the second semiconductor layer 102 is increased with respect to the layer thickness of the second semiconductor layer 102 illustrated in FIGS. 1 and 2A. A first main surface 105 of the second semiconductor layer 102 may be roughened. As a result, the roughened surface 104 of the second semiconductor layer 102 may be obtained, as is illustrated in FIG. 2C.

According to further implementations, the index smoothing layer 103 may be formed in a different manner. For example, the index smoothing layer may comprise a buffer layer formed by the method described in Lu-Chen Chen et al.: "Zigzag and Helical AlN layer prepared by glancing angle deposition ad its application as a buffer layer in a GaN-based light-emitting diode", Hindawi Publishing Corporation, Journal of Nanomaterials, Vol. 2012, Article ID: 409123. According to this method, AlN nano rod structures are sputtered by glancing angle deposition as a buffer layer on a semiconductor layer. As a result the light output power may be improved. The process of roughening the first main surface 105 of the second semiconductor layer 102 may further comprise the method described by Ya-Ju Lee et al: "High Light-Extraction GaN-Based Vertical LEDs With Double-Diffuse Surfaces", IEEE J. of Quantum Electronics, vol. 42, No. 12, December 2006. For example, the process of roughening the first main surface 105 may comprise an anisotropic etching step, e.g. using KOH as an etchant.

As is clearly to be understood, the methods described with reference to FIGS. 2A to 2C may be combined, e.g. by roughening the surface 105 of the second semiconductor layer 102, followed by forming an index smoothing layer 103.

Depending on the type of a bonding layer 106 that is to be formed over the first main surface 21 of the optoelectronic substrate 20, the index smoothing layer 103 may also be dispensed with.

Thereafter, a bonding layer 106 may be formed over the first main surface 21 of the optoelectronic substrate 20. The bonding layer 106 is transparent for electromagnetic radiation emitted by the optoelectronic semiconductor layers of the optoelectronic substrate. Further, the bonding layer 106 facilitates bonding of the optoelectronic substrate 20 to a phosphor plate as will be explained below. Examples of the bonding layer comprise dielectric oxides, conductive oxides, dielectric nitrides, conductive nitrides. Specific examples comprise silicon oxide, silicon nitride, indium tin oxide (ITO), indium zinc oxide (IZO), zinc oxides or with aluminum doped ZnO (AZO), any glass, garnets or $Al_2O_3$ having a very flat surface.

For example, this may be accomplished by an atomic layer deposition (ALD) method, sputtering such as magnetron sputtering, plasma sputtering etc. According to further implementations, a plasma enhanced chemical vapour deposition (PECVD), e.g. using tetraethylorthosilicate (TEOS) as a starting material may be employed.

According to further examples, e.g. any type of glass may be sputtered or vacuum deposited and may be employed as a bonding layer. For example, a further process of mechanical grinding may be employed after the deposition process to obtain a very flat surface for bonding.

Figure 3:
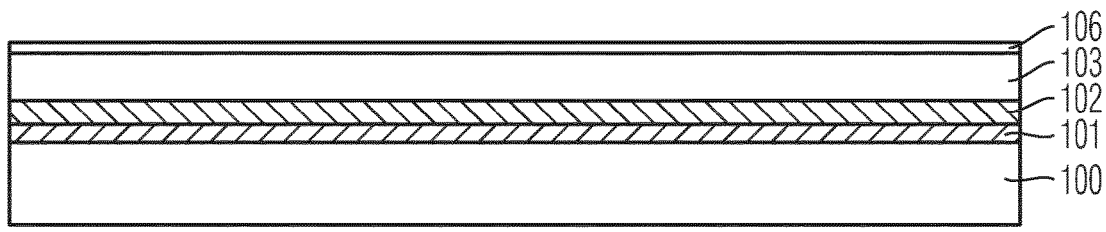
FIG. 3 shows a cross-sectional view of the optoelectronic substrate after forming a bonding layer.

FIG. 3 shows a cross-sectional view of an example of a resulting structure.

A bonding layer may be formed over a second main surface 122 of a phosphor plate 120. The phosphor plate can be e.g. a ceramic phosphor plate or a phosphor-in-glass plate as has been explained above. For example, a thickness of the phosphor plate may be larger than approximately 10 µm or even larger than 50 µm. The thickness of the phosphor plate may be less than 100 mm, more specifically less than 10 mm. However, the thickness of the phosphor plate may as well lie outside this range, depending on the purpose of the LED to be formed and the properties of the phosphor. For example, the phosphor plate may be further processed in order to be flat. For example, the bonding layer may be formed by the methods which have been explained above, such as ALD, sputtering or PECVD. A layer thickness of the bonding layer may be e.g. larger than 10 nm, for example, larger than 20 nm, and, more specifically larger than 25 nm. Generally, the layer thickness of the bonding layer may be chosen so that on one side a stable bonding between optoelectronic substrate and phosphor plate is accomplished. The thickness of the bonding layer may be chosen so that e.g. differences in topology and thicknesses of underlying layers may be compensated for. Depending on the type of bonding layer 106 formed over the optoelectronic substrate, the bonding layer 125 may not be formed over the second main surface 122 of the phosphor plate 120. In this case, the second main surface 122 of the phosphor plate 120 may be directly bonded to the bonding layer 106 formed over the optoelectronic substrate.

Figure 4A:
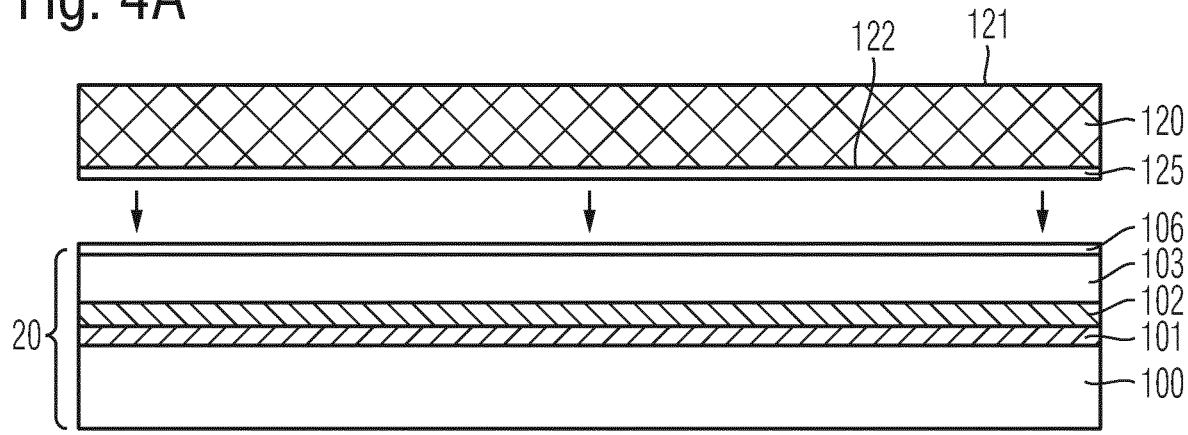
FIGS. 4A and 4B show cross-sectional views illustrating the process of combining the optoelectronic substrate with a phosphor plate.
Figure 4B:
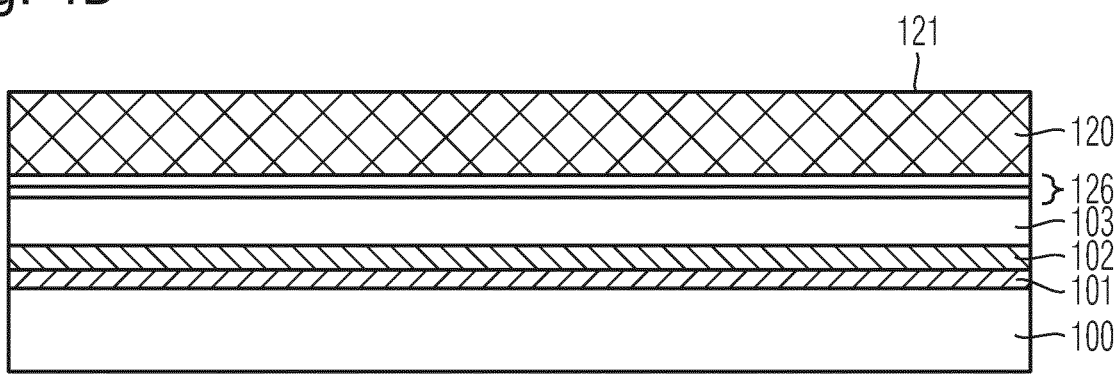

FIG. 4A shows a cross-sectional view of the optoelectronic substrate when attaching the phosphor plate 120 with the formed bonding layer 125. Phosphor plate 120 and optoelectronic substrate 20 are attached so that the bonding layer 125 on the second main surface 122 of the phosphor plate and the bonding layer 106 over the optoelectronic substrate 100 are merged to form the merged bonding layer 126 as illustrated in FIG. 4B.

The first main surface 121 of the phosphor plate 120 represents the first main surface of a stack of phosphor plate 120 and optoelectronic substrate 20. FIG. 4B shows an example of the bonded optoelectronic substrate 100 and the phosphor plate 120. For example, the optoelectronic substrate 100 and the phosphor plate 120 may be bonded by $SiO_2$—$SiO_2$ bonding. When combining the phosphor plate 120 with the optoelectronic substrate 100 and applying a low temperature of e.g. less than 400° C., the two bonding layers 106, 125 may be subject to covalent bonding. As has been described by Di Liang et al.: "Low-Temperature, Strong $SiO_2$—$SiO_2$ Covalent Wafer Bonding For III-V Compound Semiconductors-to-Silicon Photonic Integrated Circuits", Journal of Electronic Materials, vol. 37, Issue 10, pp. 1552-1559, October 2008, covalent wafer bonding is possible at low temperatures using silicon oxide as a bonding layer.

However, as is clearly to be understood, instead of this specific bonding method, further bonding methods, which may e.g. be based on different interface materials as well as adhesive bonding may be used. In particular, according to further concepts, instead of bonding the optoelectronic substrate 100 and the phosphor plate 120 via a bonding layer, a suitable adhesive or a different material may be employed.

According to further embodiments, the first main surface optoelectronic substrate 20 and the phosphor plate 120 may be directly bonded without using a bonding layer. For example, the first main surface 21 of the optoelectronic substrate and the second main surface of the phosphor plate may be treated, e.g. by polishing to obtain very smooth surfaces. In this case, optoelectronic substrate and phosphor plate may be directly bonded, e.g. due to van-der-Waals forces.

Thereafter, the growth substrate 100 may be removed from the formed compound substrate 15. For example, the growth substrate 100 may be removed by a laser lift-off method. This may comprise irradiating the growth substrate 100 with an appropriate laser such as an excimer laser, e.g. emitting a wavelength of 248 nm, in order to melt the material at the interface between growth substrate 100 and first semiconductor layer 101. Due to this melting, the growth substrate 100 may be easily removed from the first semiconductor layer 101.

Figure 5:
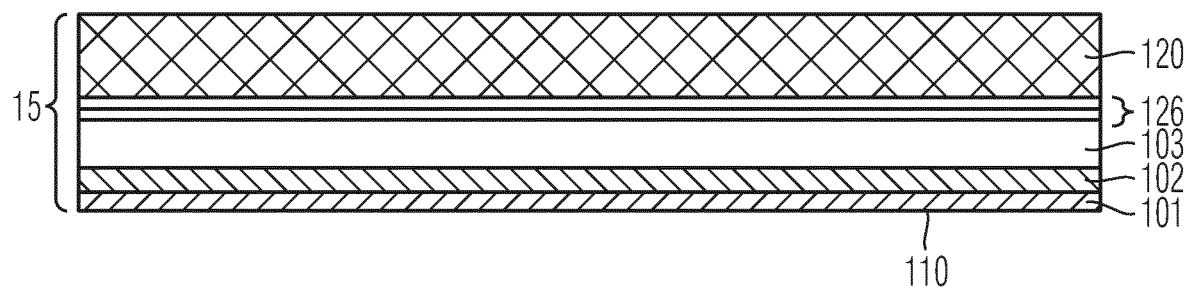
FIGS. 5 to 7 show cross-sectional views of the optoelectronic substrate including the phosphor plate after performing further processing steps.

FIG. 5 shows a cross-sectional view of an example of a resulting structure. As is illustrated, now the first main surface 110 of the compound substrate 15 is uncovered.

Figure 6:
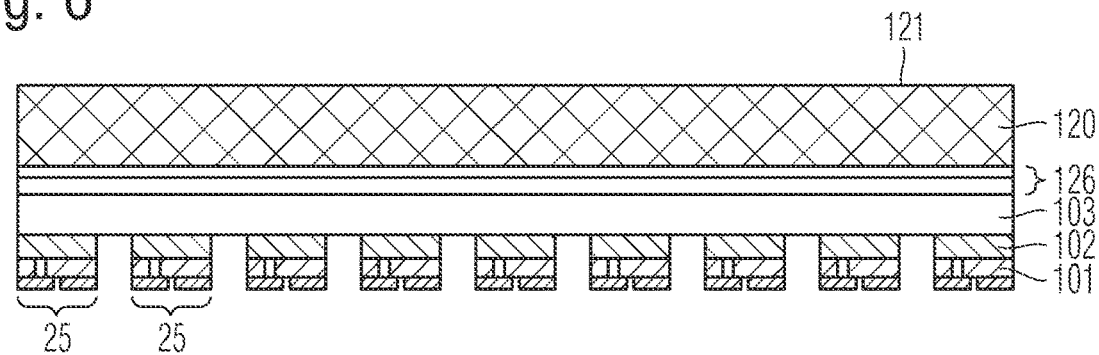

Thereafter, further processing steps may be performed in order to form components of the single optoelectronic chips 25. For example, components of the semiconductor chips such as metal mirrors, DBR (distributed Bragg reflectors), combinations thereof and others may be formed over the first main surface 110 of the first semiconductor layer 101. Moreover, etching processes may be performed in order to separate the single semiconductor chips 25 from each other. Via contacts and electrodes may be formed in and over the first semiconductor layer 101. These components will be described in more detail with reference to FIG. 9A. FIG. 6 shows an example of a resulting structure after performing these processes. Since processing is performed at the first main surface 110 of the first semiconductor layer, these processes are also referred to as flip chip processes.

Figure 7:
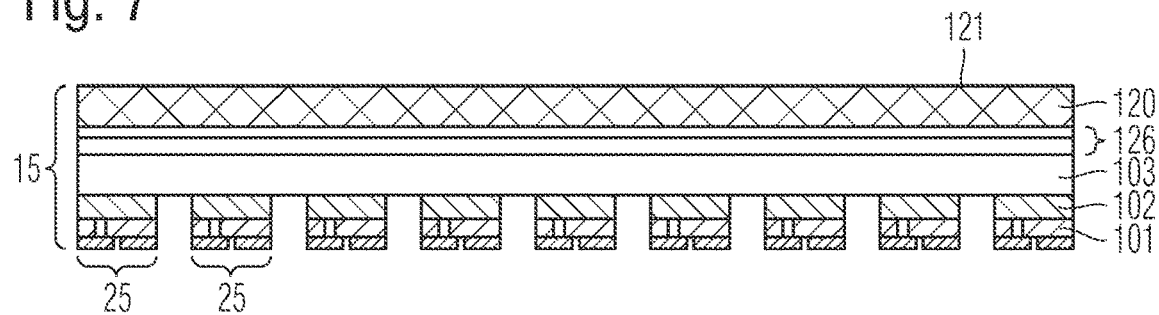

Thereafter, according to embodiments, a back grinding process may be performed in order to reduce the thickness of the phosphor plate 120. The back grinding process grinds back the first main surface 121 of the phosphor plate. For example, the phosphor plate 120 may be ground using methods which are e.g. known for grinding silicon wafers. For example, diamond powder may be used for this back grinding process. The achieved thickness of the phosphor plate 120 may be controlled by controlling the color of light emitted by the single semiconductor chips 25. For example, the color of emitted light may depend on the thickness of the phosphor plate 120. Accordingly, by monitoring the color of emitted light, an appropriate thickness of the phosphor plate 120 may be determined. FIG. 7 shows a cross-sectional view of a compound substrate 15 after this processing step.

Figure 8A:
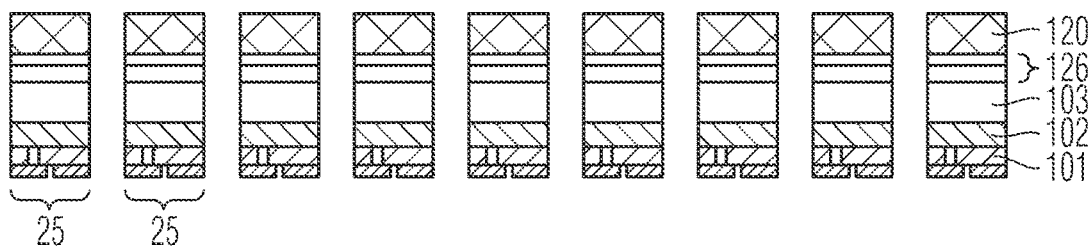
FIGS. 8A to 8B shows cross-sectional views of optoelectronic devices according to embodiments.
Figure 8B:
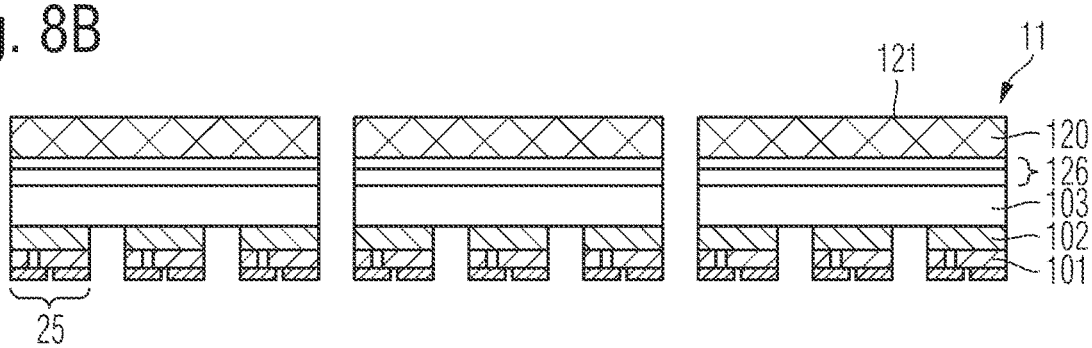

The compound substrate 15 may be singulated in single optoelectronic devices, e.g. by dicing, e.g. employing a laser method or a mechanical method such as a diamond blade. For example, the phosphor plate 120 may be diced to separate the single optoelectronic devices 10 from each other. As is illustrated in FIG. 8A, dicing may be performed in a manner so that each optoelectronic device 10 comprises exactly one semiconductor chip 25. As is illustrated in FIG. 8B, the optoelectronic device 11 may comprise more than one, e.g. three semiconductor chips 25. As is readily to be appreciated, this step may be performed so that each optoelectronic device 11 comprises a predetermined number of at least two optoelectronic chips 25. For example, a number of optoelectronic chips may be 2 to 10 or larger than 10, e.g. larger than 100 or even larger than 1000. In more detail, depending on the applications of the optoelectronic device, e.g. when the optoelectronic device is used in a dot matrix display or in a projector, the number may be larger than 4000 or even 8000.

Figure 9A:
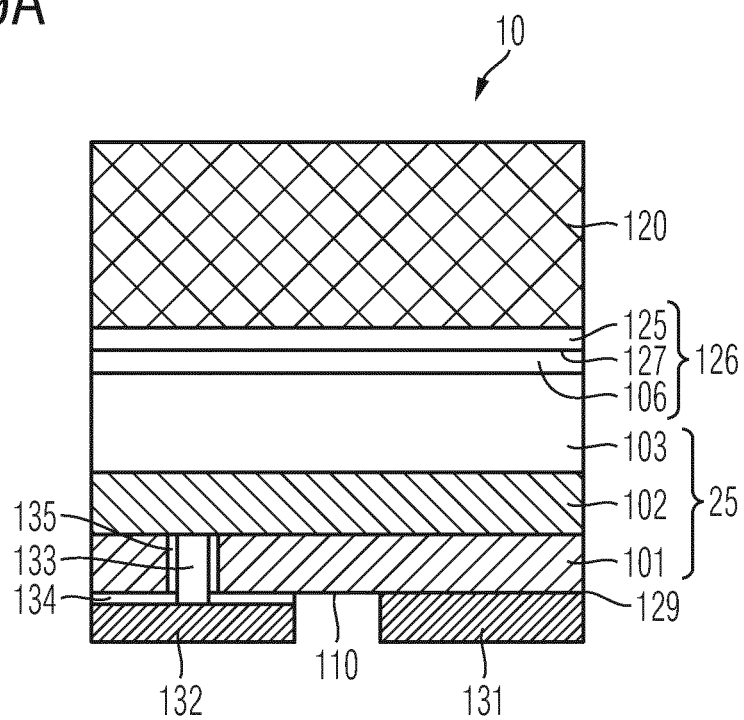
FIGS. 9A to 9C are cross-sectional views showing further optoelectronic devices.

FIG. 9A shows an enlarged cross-sectional view of the optoelectronic device comprising one single semiconductor chip 25. As is illustrated, the optoelectronic device 10 comprises an optoelectronic chip 25, a phosphor plate 120 and a bonding layer 126. The bonding layer 126 is arranged between a first main surface of the optoelectronic chip 20 and a second main surface of the phosphor plate 120. The optoelectronic chip 25 is attached to the phosphor plate 120 via the bonding layer 126. Since the bonding layer 106 over the optoelectronic substrate 20 and the bonding layer 125 over phosphor plate 120 are merged to a bonding layer 126, a bonding interface 127 between the phosphor plate and the optoelectronic substrate 20 is hardly perceivable. For example, the optoelectronic chip 25 comprises a first semiconductor layer 101 of a first conductivity type, e.g. n-type and a second semiconductor layer 102 of a second conductivity type, e.g. p-type. The first semiconductor layer 101 and the second semiconductor layer 102 are the optoelectronic semiconductor layers. A mirror layer 129 may be formed at the first main surface 110 of the first semiconductor layer 101.

The semiconductor chip 25 further comprises a first electrode 131 and a second electrode 132. For example, the first electrode 131 may electrically be connected to the first semiconductor layer 101. Moreover, the second electrode 132 may be electrically connected to the second semiconductor layer 102. By way of example, the second electrode 132 may be electrically connected to the second semiconductor layer 102 via one or more via contacts 133. For example, the second electrode 132 may be electrically insulated from the first semiconductor layer 101 by an insulating material 134. By way of example, the conductive material of the one or more via contact 133 may be insulated from the first semiconductor layer 101 by a further insulating material 135. The first electrode 131 may be in direct contact with the first semiconductor layer 101. The mirror layer 129 may be arranged between the first electrode 131 and the first main surface 110 and between the second electrode 132 and the first main surface 110.

According to embodiments, the first electrode 131 and the second electrode 132 may be arranged adjacent to the first main surface 110 of the first semiconductor layer 101, without a carrier substrate being arranged between the first and second electrodes and the first main surface 110. Accordingly, the first electrode 131 and the second electrode 132 may be arranged adjacent to the optoelectronic semiconductor layers.

According to embodiments, the second semiconductor layer 102 may directly contact the bonding layer 126. According to further embodiments, an index smoothing layer 103 as has been explained above may be arranged between the second semiconductor layer 102 and the bonding layer 126. According to embodiments, the index smoothing layer 103 is in direct contact with the second semiconductor layer 102. According to embodiments, the index smoothing layer 103 further is in direct contact with the bonding layer 126. The bonding layer 126 may be in direct contact with the phosphor plate 120. The first electrode 131 and the second electrode 132 may be arranged on a first main surface 110 of the first semiconductor layer 101, on a side remote from the second semiconductor layer 102.

Figure 9B:
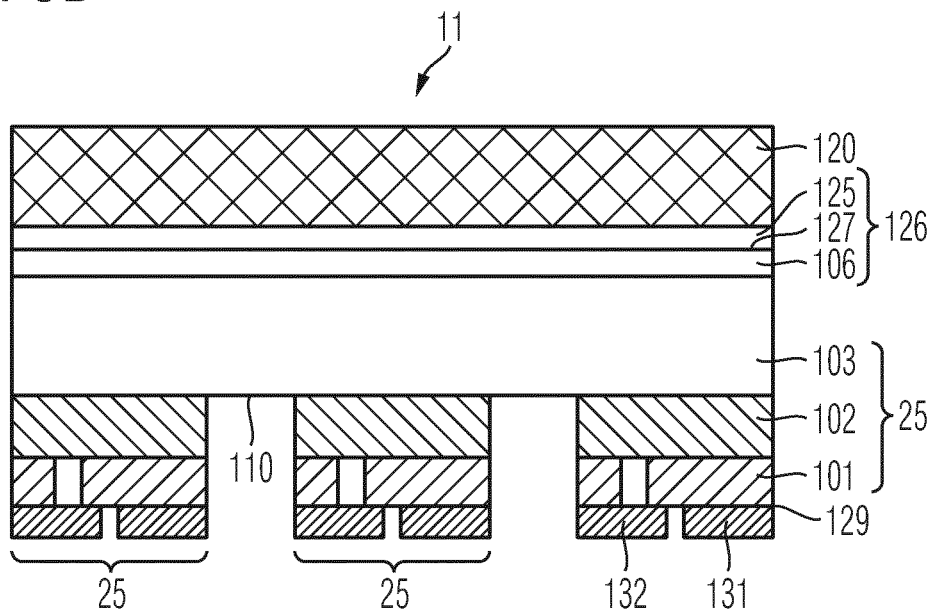

FIG. 9B shows an enlarged cross-sectional view of the optoelectronic device 11 comprising more than one semiconductor chips 25. As is illustrated in FIG. 9B, the optoelectronic device 11 may comprise three optoelectronic chips. The further components of the optoelectronic device of FIG. 9B and, in particular, the structure of the semiconductor chips, may be similar to those illustrated in FIG. 9A. For the sake of simplicity, insulating material 134, 135 has been omitted from FIG. 9B. As is to be appreciated, a suitable insulating material may be present in the optoelectronic device shown in FIG. 9B.

Figure 9C:
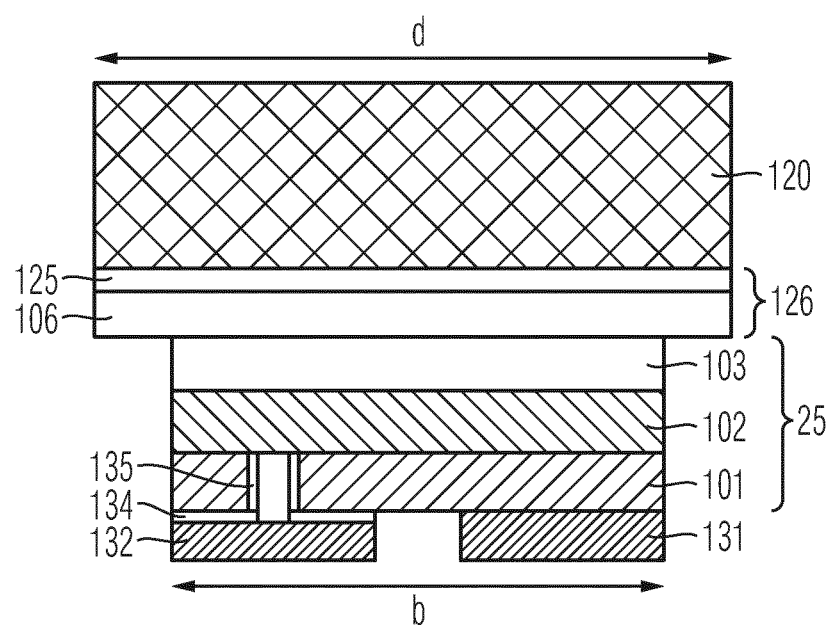

According to a modification of the optoelectronic device 10 illustrated in FIG. 9A, the phosphor plate 120 may have a width d measured in a horizontal direction which is larger than a width b of the semiconductor chip. Due to the increased size of the phosphor plate, color changes over angle may be compensated. FIG. 9C shows a cross-sectional view of an optoelectronic device according to this modification.

The optoelectronic device illustrated in FIGS. 9A to 9C implements a flip chip device, in which the electrodes 131, 132 for contacting the first and the second semiconductor layer 101, 102 are arranged at a first main surface 110 of the first semiconductor layer 101. The optoelectronic device 10, mainly emits electromagnetic radiation via the phosphor plate 120 arranged on a side remote from the first main surface 110 of the first semiconductor layer 101. Due to the special process for manufacturing the optoelectronic device which comprises removing the growth substrate, the optoelectronic semiconductor layers, i.e. the first semiconductor layer 101 and the second semiconductor layer 102 are directly mounted to the phosphor plate 120 via the bonding layer 126. In particular, according to embodiments, the growth substrate is absent from the optoelectronic device. As a result, a compact size of the optoelectronic device may be achieved. In addition, material of the optoelectronic device may be saved. Further, heat generated in the phosphor is directly conducted via the first and second semiconductor layers 101, 102 to a base material. The heat may be generated due to the wavelength conversion that takes place in the phosphor. The thermal barrier for heat generated by the phosphor is improved in the described configuration compared to conventional chip size packages since the heat generated by the phosphor does not need to pass through the growth substrate. As a consequence, generated heat may be effectively discharged.

According to the special bonding technique described, the semiconductor chip 25 is attached to the phosphor plate 120 via the bonding layer 126. If the bonding layer 126 is made of or comprises silicon oxide, the bonding may be performed at comparatively low temperatures. Further, silicon oxide is transparent to light and may be waterproof. Silicon oxide does not degrade when being exposed to light. Accordingly, this bonding technique results in an optoelectronic device having stable characteristics over a long lifetime. According to further embodiments, different bonding techniques may be employed.

Figure 10A:
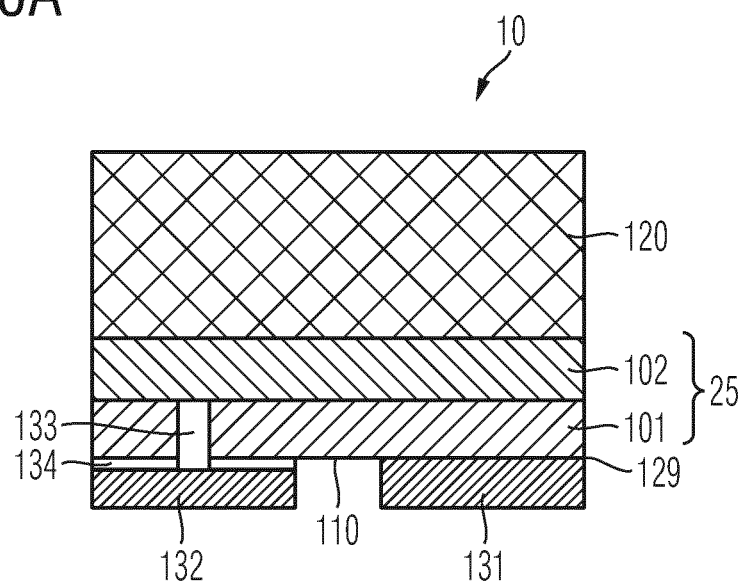
FIGS. 10A and 10B are cross-sectional views showing further optoelectronic devices.
Figure 10B:
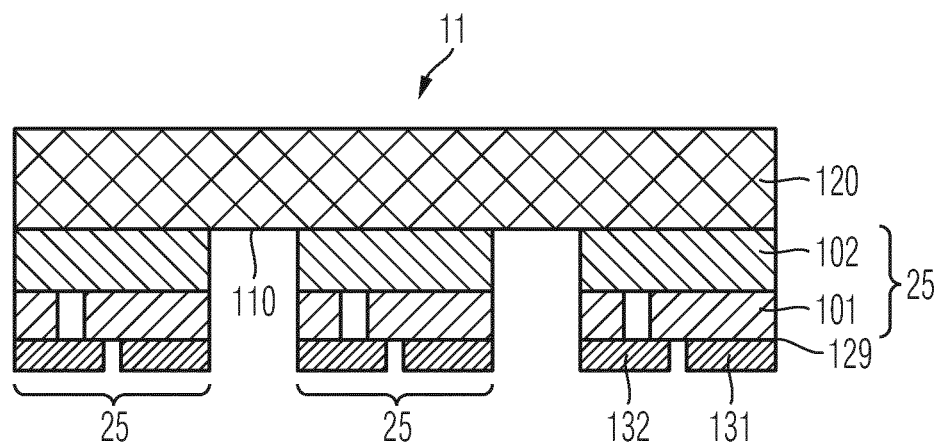

FIGS. 10A and 10B show cross-sectional views of optoelectronic devices 10, in which the optoelectronic substrate 20 has been directly bonded to the phosphor plate 120, followed by a lift-off process for removing the growth substrate. As a consequence, the semiconductor chip 25 contacts the phosphor plate 120.

The optoelectronic device 10 of FIG. 10A corresponds to the optoelectronic device 10 of FIG. 9A, with the difference that the bonding layers 106, 125 are absent between the phosphor plate 120 and the semiconductor chip 25. For example, the index smoothing layer 103 may be arranged between the phosphor plate 120 and the semiconductor chip 25. Alternatively, also the index smoothing layer 103 may be absent between the phosphor plate 120 and the semiconductor chip 25. According to further embodiments, the matrix material of the phosphor plate 120 may be suitably selected so that the index smoothing layer 103 may be dispensed with.

FIG. 10B shows an enlarged cross-sectional view of the optoelectronic device 11 comprising more than one semiconductor chips 25. As is illustrated in FIG. 10B, the optoelectronic device 11 may comprise three optoelectronic chips. The further components of the optoelectronic device of FIG. 10B and, in particular, the structure of the semiconductor chips, may be similar to those illustrated in FIG. 10A.

According to embodiments described above, an optoelectronic device 10, 11 may comprise a phosphor plate 120, an optoelectronic chip 25 comprising a layer stack of optoelectronic semiconductor layers 101, 102, and a first electrode 131 and a second electrode 132. The optoelectronic chip 25 is attached to the phosphor plate 120. The first electrode 131 and the second electrode 132 are arranged on a first main surface 110 of one of the optoelectronic semiconductor layers 101, 102, on a side remote from the phosphor plate 120. For example, the optoelectronic chip 25 may be attached to the phosphor plate 120 via a suitable adhesive, via silicon oxide or directly.

The optoelectronic device 11 as described above may comprise more than one optoelectronic chips 25. According to embodiments, the optoelectronic device 11 may comprise more than 10 or more than 100 or more than 1000, 4000 or 8000 optoelectronic chips 25.

Figure 11A:
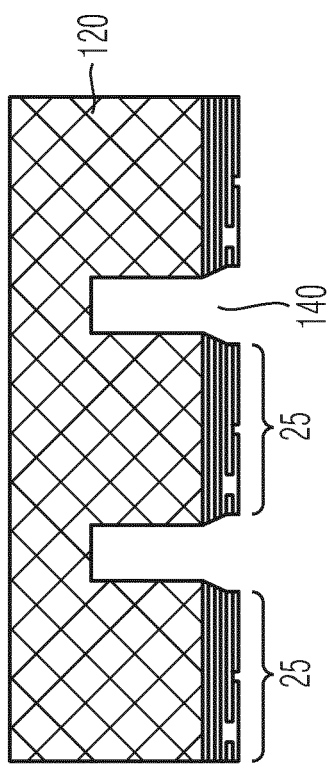
FIGS. 11A to 11C show cross-sectional views of optoelectronic devices according to further embodiments.
Figure 11B:
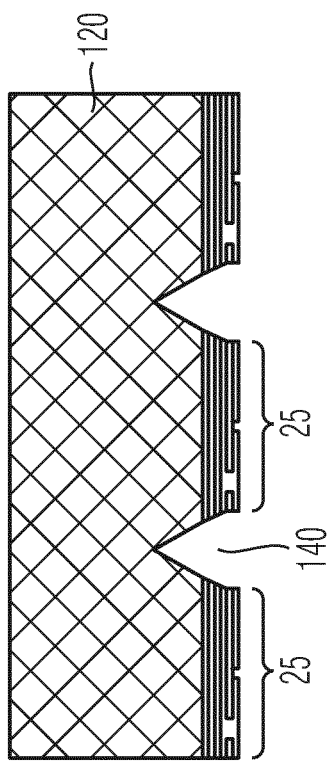
Figure 11C:
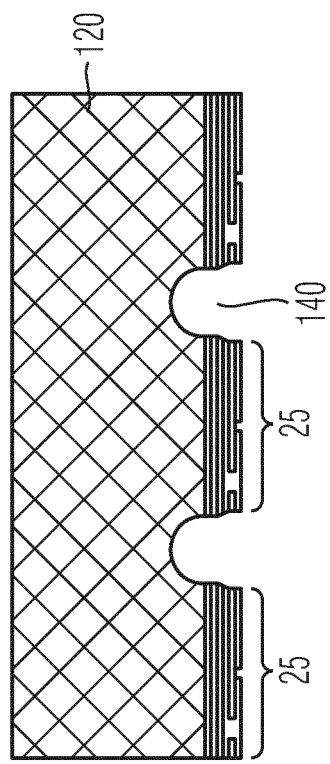

FIGS. 11A to 11C show further modifications of the optoelectronic device shown in FIG. 9B or 10B. As is illustrated, notches 140 may be formed in the phosphor plate 120. In more detail, if the optoelectronic device also comprises an index smoothing layer 103 and/or bonding layers the notches 140 may also be formed in the index smoothing layer 103 and in the bonding layer 126 between the phosphor plate 120 and the semiconductor chips 25. Due to these notches, light from the several semiconductor chips may be isolated from each other in an improved manner. As a result, pixel isolation/definition and contrast ratio may be improved.

The optoelectronic devices 10, 11 that have been explained hereinabove, may be combined or integrated with further components to form an integrated circuit 30. The integrated circuit 30 illustrated in FIG. 12A comprises the optoelectronic devices 10, 11 which have been described above and a carrier substrate 200. The optoelectronic chip 25 of the optoelectronic device 10, 11 is arranged so as to face the carrier substrate 200 and the phosphor plate 120 is arranged on a side remote from the carrier substrate 200. The optoelectronic chip 25 is mounted to the carrier substrate 200. For example, the carrier substrate 200 may be a substrate made of a suitable semiconductor material such as e.g. silicon. The carrier substrate 200 comprises a first main surface 210 and a second main surface 220. For example, the optoelectronic chip 25 of the optoelectronic device 10, 11 may be mounted to the first main surface 210. A size of the carrier substrate 200 may be larger than a size of the optoelectronic device 10, 11. According to further embodiments, the size of the carrier substrate 200 may be approximately equal to the size of the optoelectronic device 10, 11. For example, when the optoelectronic device 11 comprises more than 100 optoelectronic chips, the size of the carrier substrate 200 and the size of the optoelectronic device 11 may be approximately equal.

Wiring layers 228 may be arranged in the carrier substrate 200. Further, via contacts 223 which may accomplish an electrical contact from the first main surface 210 to the second main surface 220 may be arranged in the carrier substrate 200. According to further embodiments, the via contacts 223 may extend to wiring layers 228. Contact elements 225 may be arranged at the second main surface 220 of the carrier substrate 200. According to embodiments, a driver substrate 240 may be mounted to e.g. the first main surface 210 of the carrier substrate 200. For example, circuit elements 230 may be arranged in or over the carrier substrate 240. Examples of circuit elements 230 comprise inter alia transistors, active and passive circuit elements, capacitors and others. Driver substrate 240 and optoelectronic device 10, 11 may be arranged in juxtaposition. Components formed in or over the driver substrate 240 may be electrically connected to components inside the carrier substrate 200 via contact elements 227.

As is illustrated in FIG. 12A, the integrated circuit comprises an optoelectronic device 10, 11 which may be e.g. driven by the circuit elements 230 arranged in the carrier substrate 240. As a result, the integrated circuit may be implemented in a modular manner. Contact elements 225 are arranged at the second main surface 220 of the carrier substrate 200. As a consequence, the integrated circuit 30 may be further assembled according to application requirements. According to further embodiments, the driver substrate 240 may be arranged adjacent to the second main surface 220 of the carrier substrate 200. For example, the carrier substrate 200 may form a supporting substrate 200 or a redistribution layer of the integrated circuit 30.

FIG. 12B shows a cross-sectional view of an integrated circuit according to further embodiments. According to embodiments illustrated in FIG. 12B, the carrier substrate 200 itself may comprise circuit elements 230 in order to achieve the functionality of the integrated circuit. For example, the circuit elements 230 may be electrically connected via the wiring layers 228 and the via contacts 223 to the respective components of the optoelectronic device 10, 11. Further, the integrated circuit may be electrically connected to further components via the contact elements 225 that may be arranged at the second main surface 220 of the carrier substrate 200. For example, the carrier substrate 200 may implement an interposer. As is shown, due to the fact that the integrated circuit elements 230 are arranged in the carrier substrate 200, the integrated circuit 30 shown in FIG. 12B may have a compact size.

Figure 13:
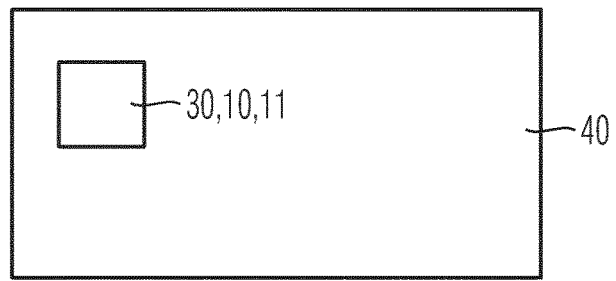
FIG. 13 shows a schematic view of an electric device according to embodiments.

FIG. 13 shows an electric device according to embodiments. The electric device comprises the optoelectronic device 10, 11 or the integrated circuit 30 described herein. The electric device may be e.g. a display device. For example, the display device may have a large number of pixels such as 16×16 and more. For example, each pixel may be implemented by a single semiconductor chip. For example, these display devices may be used in mobile devices such as smart phones, PDAs and watches. Further, the electronic device may be used in displays for computers or other kind of displays. Due to the use of LEDs instead of liquid crystal displays (LCDs), the energy efficiency may be improved. Further, these kinds of display are brighter and have an improved color. Further examples of the electric device may be a lighting system, e.g. an adaptive front lighting system for vehicles, in which each pixel may be individually controlled.

Figure 14A:
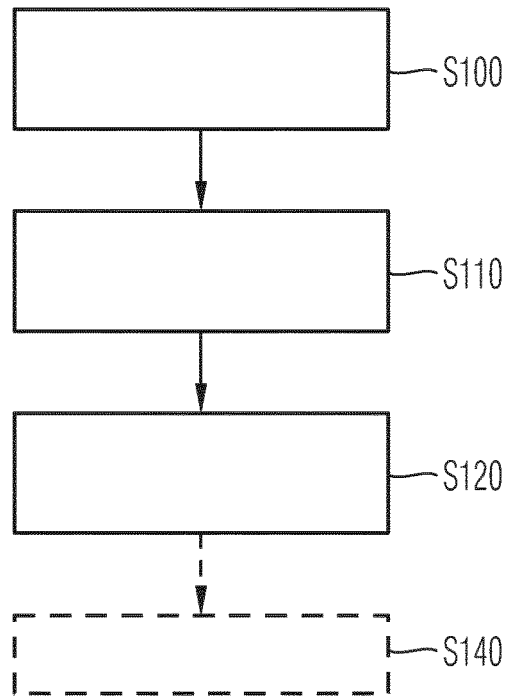
FIGS. 14A and 14B summarize methods according to embodiments, respectively.

FIG. 14A summarizes a method according to embodiments. A method for manufacturing an optoelectronic device comprises (S100) forming a first bonding layer over a first main surface of an optoelectronic substrate, (S110) forming a second bonding layer over a first main surface of a phosphor plate, and (S120) bonding the optoelectronic substrate to the phosphor plate via the first and the bonding layers. The first bonding layer and the second bonding layer may be formed at arbitrary sequences. The method may further comprise (S140) removing the growth substrate.

Figure 14B:
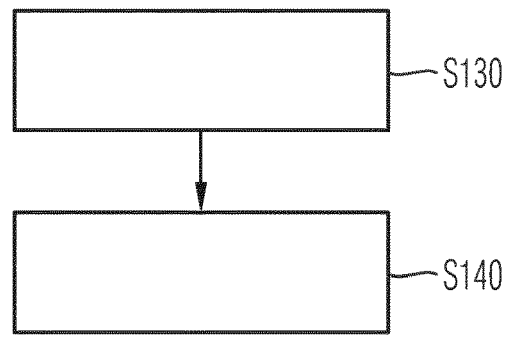

FIG. 14B summarizes a method of manufacturing an optoelectronic device according to further embodiments. The method comprises (S120) bonding an optoelectronic substrate comprising a growth substrate and optoelectronic semiconductor layers over the growth substrate to a phosphor plate, so that a side of the optoelectronic substrate remote from the growth substrate is arranged adjacent to the phosphor plate, and, thereafter, (S140) removing the growth substrate.

While embodiments have been described above, it is obvious that further embodiments may be implemented. For example, further embodiments may comprise any sub combination of features recited in the claims or any sub combination of elements described in the examples given above. Accordingly, this spirit and scope of the appended claims should not be limited to the description of the embodiments contained herein.

LIST OF REFERENCES 10 optoelectronic device
11 optoelectronic device
15 compound substrate
20 optoelectronic substrate
21 first main surface of optoelectronic substrate
25 optoelectronic semiconductor chip
30 integrated circuit
40 electric device
100 growth substrate
101 first semiconductor layer
102 second semiconductor layer
103 Index smoothing layer
104 roughened surface
105 first main surface of second semiconductor layer
106 bonding layer
110 first main surface of first semiconductor layer
120 phosphor plate
121 first main surface of phosphor plate
122 second main surface of phosphor plate
125 bonding layer
126 bonding layer
127 bonding interface
129 mirror
131 first electrode
132 second electrode
133 via contact
134 insulating material
135 insulating material
140 notch
200 carrier substrate
210 first main surface of carrier substrate
220 second main surface of carrier substrate
223 via contact
225 contact elements
227 contact elements
228 wiring layer
230 circuit element
240 driver substrate

The invention claimed is:

1. An optoelectronic device comprising:
a phosphor plate having a first and a second main surface;
at least two optoelectronic chips;
each of the optoelectronic chips comprising a layer stack including a first optoelectronic semiconductor layer and a second optoelectronic semiconductor layer;
a first electrode; and
a second electrode;
wherein the optoelectronic chips are attached to the second main surface of the phosphor plate, wherein the second optoelectronic semiconductor layer is arranged between the phosphor plate and the first optoelectronic semiconductor layer, the first electrode and the second electrode being arranged on a first main surface of the first optoelectronic semiconductor layer on a side remote from the phosphor plate, the second electrode directly contacting the first optoelectronic semiconductor layer; and
notches formed in the second main surface of the phosphor plate, wherein the notches are arranged between adjacent optoelectronic chips.

2. The optoelectronic device according to claim 1, wherein the optoelectronic chips are attached to the phosphor plate via a bonding layer between a first main surface of the second optoelectronic semiconductor layer and a second main surface of the phosphor plate.

3. The optoelectronic device according to claim 2, wherein the bonding layer contacts the phosphor plate.

4. The optoelectronic device according to claim 2, further comprising an index smoothing layer between the optoelectronic chip and the bonding layer.

5. The optoelectronic device according to claim 2, wherein the bonding layer is silicon oxide.

6. An integrated circuit comprising the optoelectronic device according to claim 1, and a carrier substrate, the optoelectronic chip of the optoelectronic device being mounted to the carrier substrate.

7. The integrated circuit according to claim 6, further comprising circuit elements arranged in the carrier substrate.

8. The integrated circuit according to claim 6, further comprising circuit elements arranged in a driver substrate mounted to the carrier substrate.

9. An electric device comprising the integrated circuit according to claim 6, wherein the electric device is selected from the group of a display device, a lighting system, or combinations thereof.

10. An electric device comprising the optoelectronic device according to claim 1, wherein the electric device is selected from the group of a display device, a lighting system, or combinations thereof.

11. A method for manufacturing an optoelectronic device, wherein the method comprises:
bonding an optoelectronic substrate to a second main surface of a phosphor plate, the optoelectronic substrate comprising a growth substrate and optoelectronic semiconductor layers over the growth substrate, such that a side of the optoelectronic substrate remote from the growth substrate is arranged on the second main surface of the phosphor plate; and
removing the growth substrate;

separating the optoelectronic substrate into a plurality of optoelectronic chips;

forming notches in the second main surface of the phosphor plate between adjacent optoelectronic chips.

12. The method according to claim 11, further comprising forming a first bonding layer over a first main surface of the optoelectronic substrate before bonding the optoelectronic substrate to the phosphor plate.

13. The method according to claim 12, further comprising forming an electrode contacting the optoelectronic semiconductor layers after removing the growth substrate.

14. The method according to claim 11, wherein a first main surface of the optoelectronic substrate is directly bonded to the phosphor plate.

15. The method according to claim 11, wherein the optoelectronic semiconductor layers comprise a first optoelectronic semiconductor layer and a second optoelectronic semiconductor layer, wherein the second optoelectronic semiconductor layer is arranged between the phosphor plate and the first optoelectronic semiconductor layer; and wherein a first main surface of the first optoelectronic semiconductor layer is uncovered after removing the growth substrate.

16. The method according to claim 15, further comprising forming further components of the optoelectronic chips over the first main surface of the first semiconductor layer.

\* \* \* \* \*